(12) United States Patent
Donoso et al.

(10) Patent No.: US 6,612,014 B1
(45) Date of Patent: Sep. 2, 2003

(54) DUAL POST CENTRIFUGAL WAFER CLIP FOR SPIN RINSE DRY UNIT

(75) Inventors: Bernardo Donoso, San Jose, CA (US); Joseph J. Stevens, San Jose, CA (US); Donald J. Olgado, Palo Alto, CA (US); Alexander Sou-Kang Ko, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/616,308

(22) Filed: Jul. 12, 2000

(51) Int. Cl.⁷ ............................................... B23Q 7/00
(52) U.S. Cl. ................... 29/559; 34/58; 216/91
(58) Field of Search .................... 216/91; 34/58; 29/559

(56) References Cited

U.S. PATENT DOCUMENTS

| | | | |
|---|---|---|---|
| 3,727,620 A | 4/1973 | Orr | 134/95 |
| 4,489,740 A | 12/1984 | Rattan et al. | 134/140 |
| 4,519,846 A | 5/1985 | Aigo | 134/15 |
| 4,677,758 A * | 7/1987 | Aigo | |
| 4,788,994 A | 12/1988 | Shinbara | 134/157 |
| 5,224,504 A | 7/1993 | Thompson | 134/155 |
| 5,322,079 A | 6/1994 | Fukutomi et al. | 134/153 |
| 5,376,216 A | 12/1994 | Yoshioka et al. | 156/345 |
| 5,377,708 A | 1/1995 | Bergman et al. | 134/105 |
| 5,566,466 A * | 10/1996 | Hearne | |
| 5,775,000 A * | 7/1998 | Maekawa | |
| 5,851,041 A * | 12/1998 | Anderson et al. | |
| 5,974,681 A * | 11/1999 | Gonzalez-Martin et al. | |
| 6,167,893 B1 * | 1/2001 | Taatjes et al. | |
| 6,274,506 B1 * | 8/2001 | Christenson et al. | |
| 6,290,865 B1 * | 9/2001 | Lloyd et al. | |

OTHER PUBLICATIONS

Applied Materials, Inc. PCT/US01/41255, International Search Report mailed Apr. 2, 2002.
U.S. patent application Ser. No. 09/350,212.
U.S. patent application Ser. No. 09/263,649. Now pat No. 6254760.

* cited by examiner

*Primary Examiner*—Douglas Olms
*Assistant Examiner*—Steve Blount
(74) *Attorney, Agent, or Firm*—Moser, Patterson & Sheridan

(57) ABSTRACT

An apparatus and associated method for securing a wafer to a SRD spider, the SRD spider has a plurality of spider arms. The apparatus includes a plurality of spaced surfaces disposed on a distal end of one of the spider arms, each of the surfaces being spaced perpendicularly from the longitudinal axis of the spider arm. In one aspect, the two surfaces are positioned to limit production of a wedging force between that spaced surface and the wafer. In one embodiment, a post at least partially defines each one of the plurality of spaced surfaces.

12 Claims, 9 Drawing Sheets

DUAL POST CENTRIFUGAL WAFER CLIP FOR SPIN RINSE DRY UNIT

BACKGROUND OF THE INVENTION

1. Field of the Invention

The present invention generally relates to an apparatus and method for securing a wafer to a support assembly and, more particularly to a method and apparatus for securing a wafer to a support assembly to provide a wedging action between the wafer and the support assembly.

2. Background of the Related Art

Sub-quarter micron, multi-level metallization is an important technology for the next generation of ultra large scale integration (ULSI). As circuit densities increase as a result of technological progress, the widths of these circuit features, as well as the width of the dielectric materials between the features, decrease considerably. However, the height of the dielectric layers remains substantially constant. Therefore, the aspect ratios of the features (i.e., their height divided by width) increase. A great amount of ongoing effort is directed at the formation of void-free, nanometer-sized circuits including features having aspect ratios of 4:1, or higher.

One process and system gaining acceptance for filling small features with copper is electroplating (ECP) and related processes. ECP is a wet process and requires rinsing and drying steps that follow the ECP process. One device commonly associated with electroplating and other wet processes to accomplish the rinsing and drying of the substrate is a spin-rinse-dry (SRD) unit. Wafers undergoing a SRD cycle are secured to a cross member referred to as a SRD holder (usually in a face-up position) by a plurality of wafer clips which are mounted on the SRD unit.

The SRD unit performs a SRD cycle on a wafer; the SRD cycle comprises a rinse cycle followed by a dry cycle. Alternatively, in a SRD cycle, the rinse cycles may be alternated with the dry cycles. The SRD unit rotates the SRD holder (and a wafer contained therein) at a high angular velocity subjecting the wafer to relatively high accelerations. SRD units may change angular rotational direction of the SRD holder between a clockwise and a counter-clockwise direction during both the rinse cycle and the dry cycle. The changing of angular rotational directions by the SRD holder applies further centrifugal accelerations to the wafer that enhances the drying characteristics of the SRD unit. During the rinse cycle, a surface of the wafer supported by the SRD holder is sprayed with cleaning or rinsing fluids to facilitate removal of unwanted material from the surface of the substrate. During the dry cycle, the angular rotation imparted to a wafer supported by the SRD holder effectively dries the wafer through the combined action of centrifugal forces and air flow.

However, the wafer may become wedged in position in a SRD holder because of the angular rotations of the SRD holder about a vertical axis during the SRD cycle. Robot manipulators follow mechanical robot motions such as lifting, rotating, etc. In lifting the wafer by the robot manipulator, the upward force of the robot end effector or blade on the bottom of the wafer to lift the wafer has to overcome the wedging force. When a considerable amount of lifting force is applied upwardly to the wafer to dislodge the wafer from between the posts of the SRD holder, and a considerable wedging force is generated, the wafer may build up potential energy. This potential energy is demonstrated by bowing of the wafer, and the wafer may spring out of the SRD holder and become damaged or mis-oriented as the wafer springs from the SRD holder. The upward force applied to the wafer as the wafer is held in the wafer's wedged position may also break the wafer.

Therefore, there is a need for a clip arrangement that securely wafers to the SRD unit in a manner that limits the wedging force that exists between the wafer and the SRD holder. Reducing the wedging force would also reduce the force necessary to remove the wafer from the SRD holder.

SUMMARY OF THE INVENTION

The present invention generally relates to a SRD unit. In one aspect, an apparatus and associated method is described for securing a wafer to a SRD holder. The SRD holder has a plurality of arms. The apparatus includes a plurality of spaced surfaces disposed on a distal end of one of the arms, each of the surfaces being spaced perpendicularly from the longitudinal axis of the arm. In one aspect, the two surfaces are positioned to limit production of a wedging force between the spaced surface and the wafer. In one embodiment, a post at least partially defines each one of the plurality of spaced surfaces.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
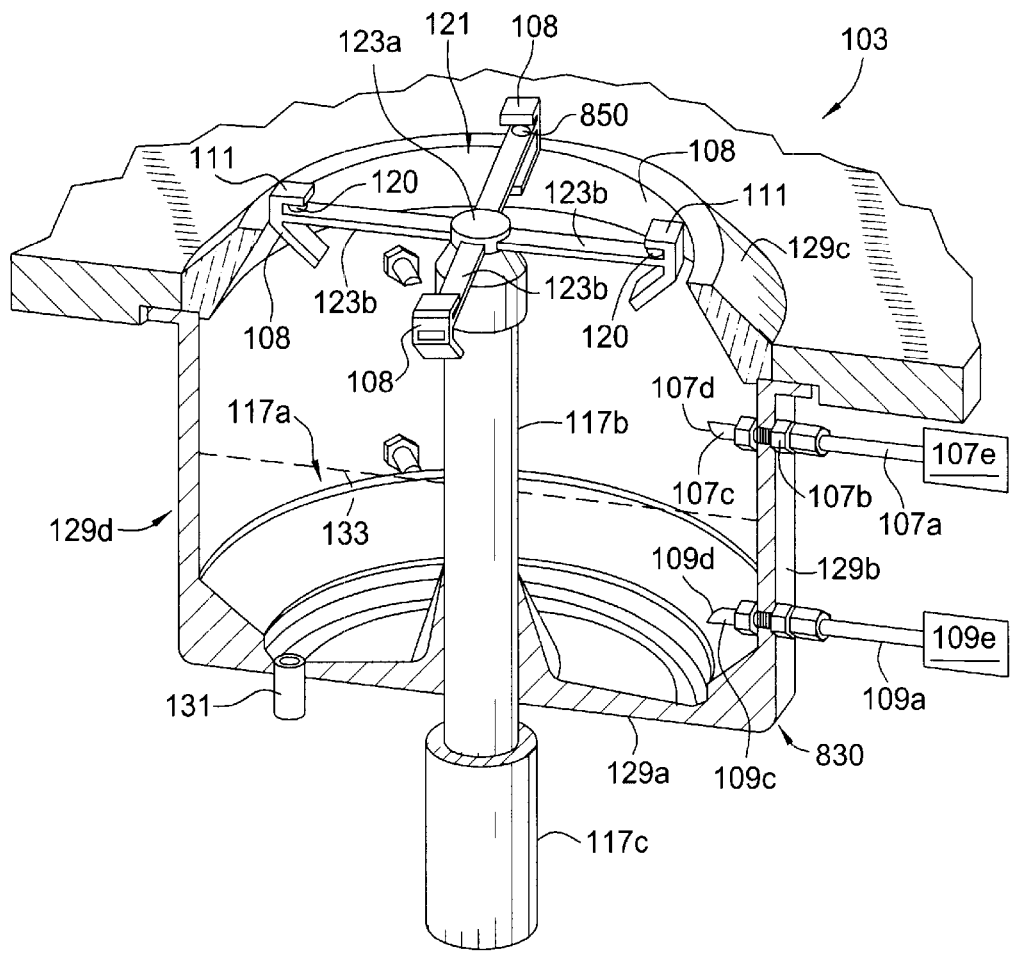
FIG. 1 is a perspective view of one embodiment of a spin-rinse-dry (SRD) unit including an SRD unit, the SRD unit includes a plurality of clips.

FIG. 1 is a perspective view of a spin-rinse-dry (SRD) module 103 including an SRD spider 121. The SRD module 103 comprises a bottom 129a and a sidewall 129b, and an upper shield 129c that collectively defines a SRD module bowl 129d. The upper shield 129c attaches to the sidewall (or alternatively is formed as a unitary member) and assists in retaining the fluids within the SRD module. Alternatively, the upper shield 129 can be omitted and a removable cover fits over the sidewall 129b during operation. A fluid supply system is fluidly connected to the SRD module bowl 129d. The fluid supply system includes a first conduit 107a, a first fluid inlet 107c, a controllable supply 107e, a first nozzle 107d, a second conduit 109a, a second fluid inlet 109c, a controllable supply 109e, and a second nozzle 109d.

A pedestal 117a, located in the SRD module, includes a pedestal support 117b and a pedestal actuator 117c. The SRD spider 121 is secured to the upper end of the pedestal 117a. The SRD spider 121 includes a hub 123a, plurality of arms 123b, a plurality of O-rings 120, and a plurality of clips 108. The arms 123b extend radially in a horizontal plane from the hub 123a. A single clip 108 is rotatably attached to the remote end of each arm 123b, and can be rotatably displaced between an open position and a closed position. The O-rings 120 of the SRD spider 121 support a substrate 112 during processing of the substrate. The pedestal actuator 117c rotates the pedestal and the SRD spider 121 to cause spinning of the substrate. The pedestal actuator 117c raises and lowers the SRD spider 121 to move the substrate between transfer and process positions. The substrate may be held in place on the SRD spider 121 by a plurality of clamps or clips 111. The clamps 111 pivot between a closed process position and an open transfer position under the influence of centrifugal force to respectively engage or permit removal of the substrate from the SRD unit.

In one embodiment, the clamps are spaced from the substrate such that the clamps engage the substrate only when the substrate lifts off the SRD spider 121. The substrate may lift off the SRD spider due to a lift produced by the substrate interacting with air during the processing (spinning) of the substrate. Vacuum passages (not shown) may also be used in certain embodiments to secure the substrate to the SRD spider 121. The pedestal arms 123b of the SRD spider 121 having a minimized cross sectional configuration, so that the fluid through the second nozzle impacts as much surface area on the substrate as possible. An outlet 131 allows fluid to be removed from the SRD module.

Figure 2:
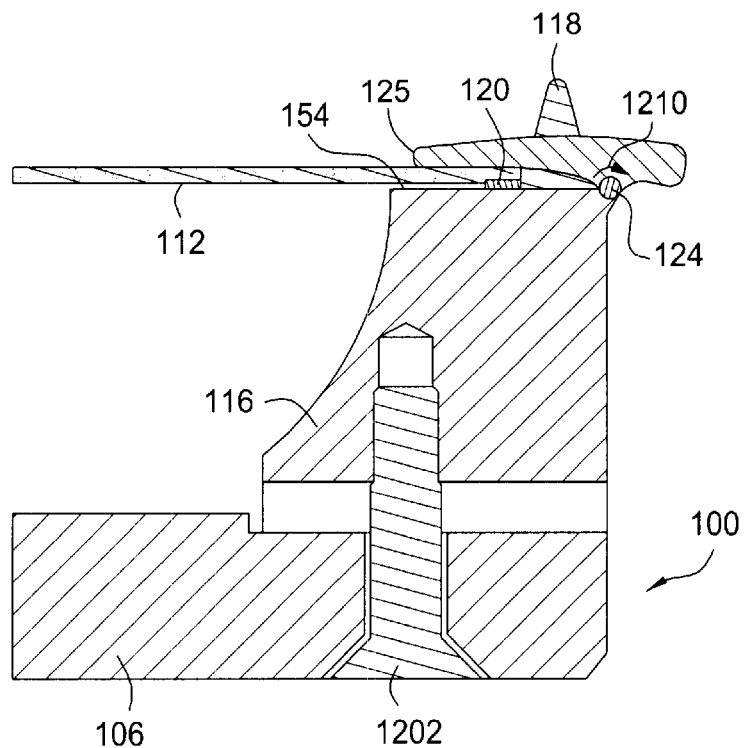
FIG. 2 is a side cross sectional view of one embodiment of single post clip.

FIG. 2 shows one embodiment of the single post clip 108 that can be applied to the SRD spider 121 shown in FIG. 1. The single post clip 108 includes a single vertically oriented post 118, the O-ring 120, and a centrifugal wafer clip 122. The single vertically oriented post 118 is located proximate a distal end of a spider leg adjacent the periphery of the wafer to limit relative radial travel of the wafer relative to the SRD spider. The O-ring 120 is mounted proximate the SRD spider leg to support a wafer that is positioned in the SRD spider. Each centrifugal wafer clip in the single post clip can be displaced between open and closed positions. When a single post clip is in the open position, a wafer can be inserted downwardly into, or removed upwardly from, the SRD spider. When the single post clip is in the closed position, a wafer contained in the SRD spider is limited from excessive upward motion relative to the single post clip 108.

The first conduit 107a is connected between the controllable supply 107e and the first fluid inlet 107c. Fluid from the first fluid supply 107e that flows through the first nozzle 107d is directed at the upper surface of a substrate in a processing position on the SRD spider 121. The first conduit 107a may be a hose, a pipe, a tube, or another fluid-containing conduit. The controllable supply 107e provides the flow of the first fluid and may include a variety of valves including a needle, globe, butterfly, or other type of valve. Such valves may include a valve actuator, such as a solenoid, that can be controlled with a controller. The first conduit 107a includes a mounting portion 107b to attach to the SRD module. The first fluid inlet is shown above a level 133 occupied by a substrate during processing. The first fluid inlet 107c fluidly connects to a first nozzle 107d that delivers the first fluid through the controllable supply 107e under pressure onto the substrate upper surface during processing. However, multiple first nozzles 107d could be applied to multiple fluid inlets that are spaced about the inner periphery of the SRD module bowl 129d.

The second conduit 109a is connected between the controllable supply 109e and the second fluid inlet 109c. The second fluid inlet 109c is fluidly connected to the second nozzle 109d. The second nozzle 109d is below a level 133 that is occupied by a substrate during processing. The second nozzle 109d is angled upward and directs fluid to a lower surface of the substrate. The second fluid inlet may include a plurality of nozzles, a plurality of fluid inlets and mounting locations about the periphery of the SRD module bowl 129d. Each fluid inlet can be extended into the SRD module at a variety of adjustable positions. For instance, if the flow is desired to be applied at a certain angle that is directed back toward the SRD module periphery along the edge of the substrate, the nozzles could be extended radially inward and the discharge from the nozzles is directed back toward the SRD module periphery.

Wafers are typically either "notched" or "flatted" to provide an orientation reference point. While the described embodiment of invention is described as being applied primarily to flatted wafers, any type of wafer, substrate, or object is within the scope of the present invention. The clips used on a particular SRD spider are configured to engage either a wafer. The notches and the flatted portions of the respective wafers provide repeatable indications of the orientation of the wafers based on the respective location of the notched or flatted edge. Wafers are oriented during certain wafer processing steps to ensure that the location and orientation of the clips relative to the wafer are correct. The relative orientation of a wafer can be determined based upon the location of the flatted edge or notch with a wafer orienter.

Figure 6A:
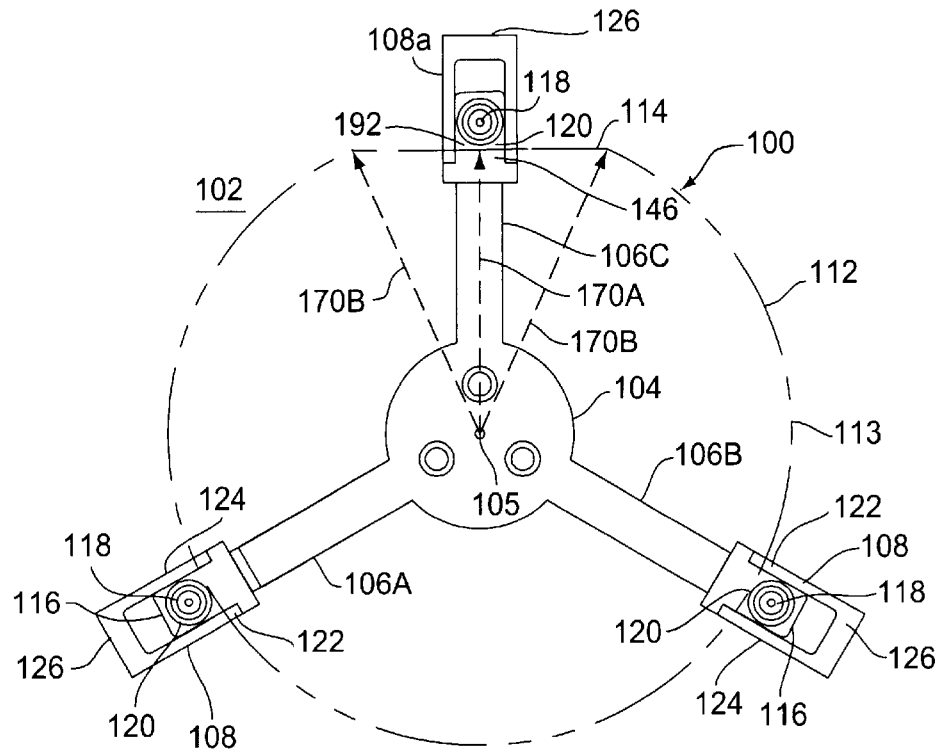
FIG. 6A is a top view of the SRD spider shown in FIG. 1 with an outline of a wafer inserted in the SRD spider.
Figure 6B:
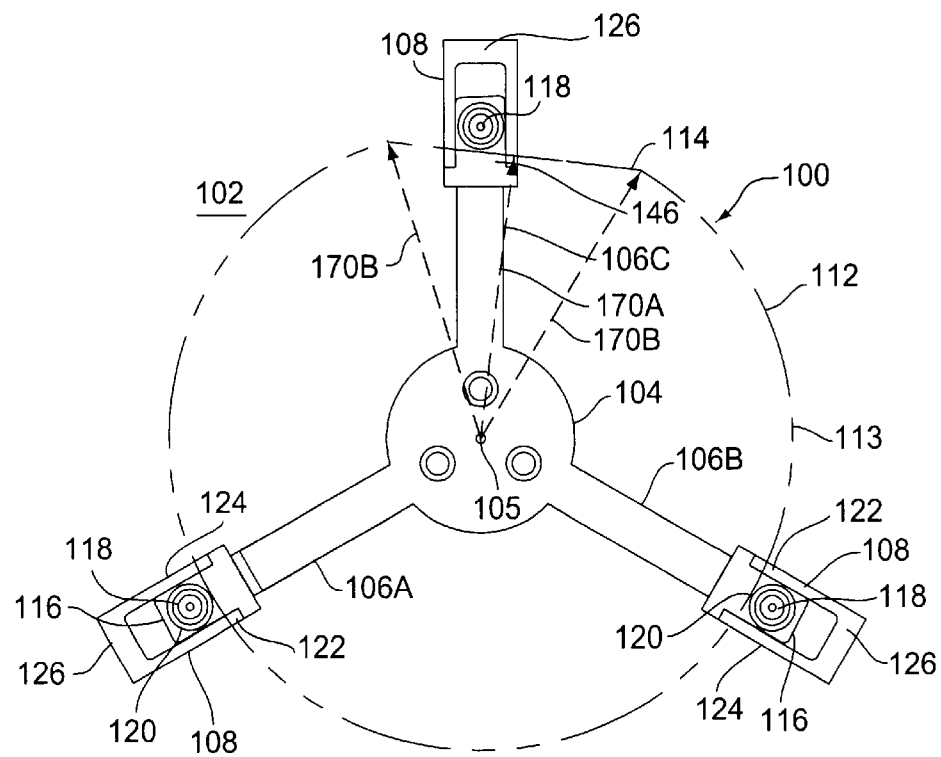
FIG. 6B is the FIG. 6A SRD spider having an outline of a wafer wedged in the SRD spider.

An outline of a flatted wafer 112 is shown in FIGS. 6A and 6B. Wafers 112 include flatted edge portion 114 that represent an irregularity in the general circular edge portion 113 of the wafer. The radius of the circular edge portion 113 of the wafer about vertical axis 105 is uniform, while the non-constant radius of the flatted edge portion 114 changes, but is less than that of the radius of the circular edge portion 113 about the vertical axis. The non-constant radius of the flatted edge portion 114 decreases to a minimum circumferential radius 170A, and then increases to the maximum circumferential radius point 170B. As the wafer is initially inserted in the SRD spider 121, the minimum circumferential radius point 170A is adjacent the single vertically oriented post 118. A space or clearance 192 (shown in FIG. 6A) is defined between the flatted edge portion 114 and the single vertically oriented post 118. The space or clearance 192 between the flatted edge portion 114 and the single vertically oriented post 118 of the single post clip 108b provides for some free play between the wafer 112 and the SRD spider 121 when the flatted edge portion 114 is adjacent the single vertically oriented post 118. The flatted edge portion 114 is adjacent the single vertically oriented post 118, for example, following insertion of the wafer in the SRD spider 121 but prior to insertion of the SRD spider.

As the SRD spider accelerates in either rotational direction, the wafer will be accelerated relative to the SRD spider in the opposite rotational direction because the angular inertia between the wafer and the SRD spider. The wafer rotating within the SRD spider 121 causes the minimum circumferential radius point 170A of the wafer 112 to shift relative to the single vertically oriented post 118 of the single post clip 108. A portion of the flatted edge 114 having a greater diameter than the minimum circumferential radius point 170A shifts by rotation to proximate the single vertically oriented post 118 of the single post clip 108. This shifting results in the reduction of the dimension of the clearance 192 until the clearance reduces to zero as the flatted edge is forced into contact with the single vertically oriented post 118. Sufficient relative rotation between the wafer and the SRD spider has the effect of "wedging" the wafer between the posts of the multiple single post clips. The wedging relates to the shape and dimensions of the wafer and the shapes and dimensions of the posts in the SRD spider. When the wafer is wedged in position, the wafer is effectively secured relative to the SRD spider. This wedging causes the wafer and the SRD spider to rotate in the horizontal plane as a single unit.

1. SRD Spider Overview

Figure 7:
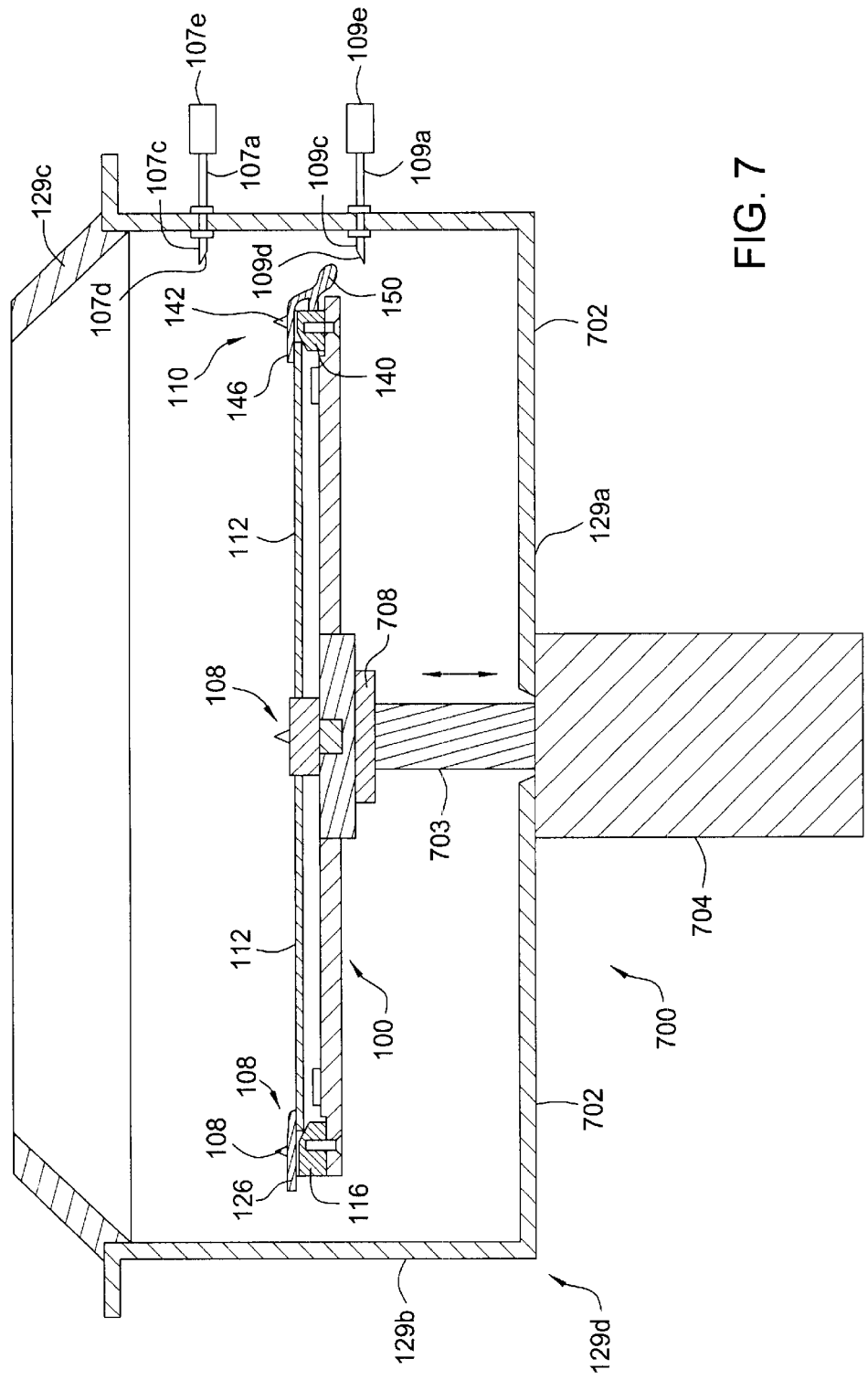
FIG. 7 is a side sectional view of the SRD unit including a SRD spider as taken through section lines 7—7 in FIG. 3.

FIG. 7 shows one embodiment of a SRD unit 700 that comprises a SRD housing 702, a telescopic pedestal 703, a SRD motor 704, two single post clips 108, a multiple surface clip 110, and a SRD spider 100. The SRD unit 700 is either a stand-alone unit or provided in close proximity to other process chambers as, for example, a part of a cluster tool. The SRD spider 100 is fixedly mounted to the telescopic pedestal 703. The SRD motor 704 provides angular motive force to rotate telescopic pedestal 703 relative to the SRD housing 702. The telescopic pedestal 703 can raise or lower the SRD spider 100 relative to the SRD housing 702 into the respective transfer or process positions of the SRD spider 100. An associated motive force element, such as a stepper motor, rack and pinion motor, linear drive motor, or lead screw motor is applied to the telescopic pedestal to adjusts the vertical height of the SRD spider 100.

When the telescopic pedestal 703 raises the SRD spider 100 into the SRD spider's transfer position, a wafer 112 may be loaded or unloaded from the SRD spider. When the telescopic pedestal 703 is displaced downwardly to lower the SRD spider 100 into the SRD spider's process position, the SRD unit 700 can perform a SRD process on the wafer. The SRD housing 702 is configured with nozzles 107d, 109d that are positioned to direct fluid at the wafer 112. The wafer can be controllably spun so the centrifugal force applied to the wafer has the effect of spinning the fluid off the wafer. The SRD motor 704 provides an adjustable rotational motive force between the SRD housing 702 and the SRD spider 100 to control the angular velocity, direction, and acceleration of the SRD spider. The motor is any type of rotary motor that can go through quick accelerations and decelerations, and even change directions, such as a servo motor. A gearing arrangement may be provided between the SRD motor 704 and the telescopic pedestal 703. The rotational motion outputs of the SRD motor 704 rotates the SRD shaft at the desired angular velocity to spin the wafer 112 at a sufficient angular velocity to spin fluid off the wafer. A SRD hub 708 that is rigidly connected to the telescopic pedestal 703 rotates with the output of the SRD motor 704, and provides a surface to which the SRD spider 100 may be mounted.

A liquid or cleaning solution may be mixed into the fluid applied to the wafer 112 during certain rinsing operations of the SRD unit through the first nozzle 107d and the second nozzle 109d. The interaction between the liquids and/or cleaning solutions and the wafer may be enhanced by the centrifugal forces applied from the SRD unit 700 to the SRD spider. The rapidly changing angular velocities and accelerations of the wafer 112 thus aid the cleaning process. After the SRD spider 100 has cleaned the wafer 112, the wafer may be rinsed under a stream of de-ionized water. After rinsing, the SRD spider 100 rotates the wafer 112 at a high angular velocity to dry the wafer. The residual water is typically dried from the surface of the wafer under the combined influence of centrifugal force and evaporation. Any water remaining on a wafer after the spin-rinse-dry cycle is completed can be removed by blowing hot air over the surface of the wafer.

Figure 6C:
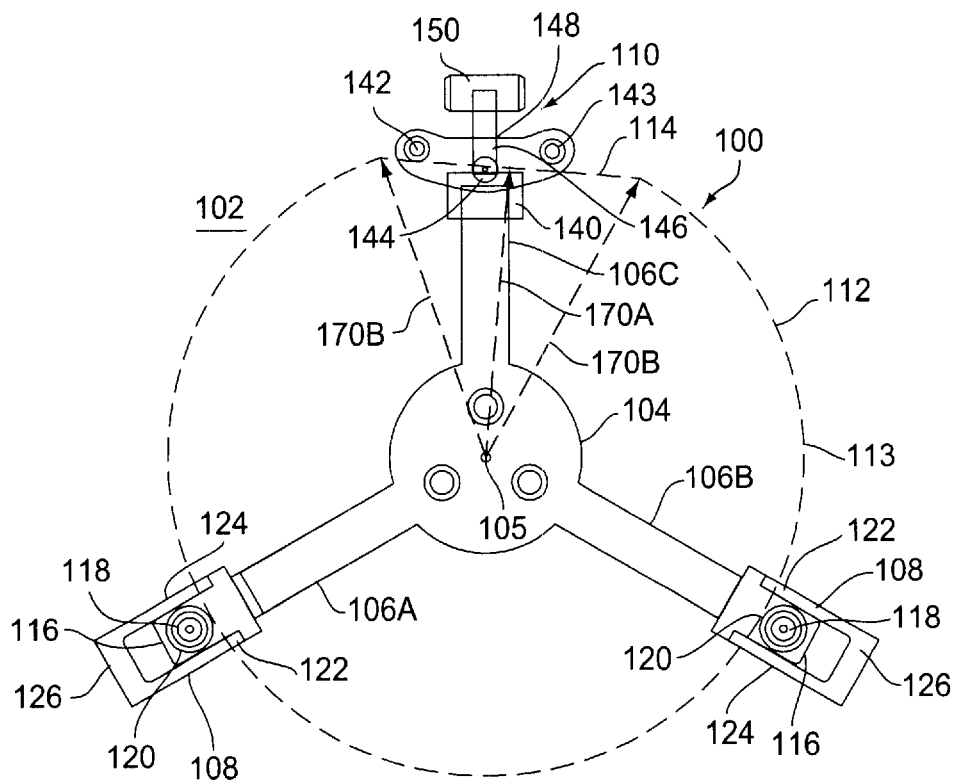
FIG. 6C is a top view of one embodiment of a SRD spider comprising a plurality of single post clips and one embodiment of multiple surface clip of the present invention.

FIG. 6C shows one embodiment of a SRD spider 100. The SRD spider 100 comprises a spider hub 104, spider legs 106 (106A, 106B, and 106C), a plurality of single post clips 108 (one single post clip 108 is attached to the distal end of each of the spider legs 106A and 106B), and a multiple surface clip 110 attached to the distal end of spider leg 106C. The structure and operation of the multiple surface clip 110 and the single post clip 108 are described below. Though three spider legs are shown, more spider legs may be used where desired or applicable.

When all of the single post clips 108 and the multiple surface clip 110 of a SRD spider 100 are in a closed position, the clips 108, 110 interact to retain a wafer 112 positioned on the SRD spider 100. When all the single post clips 108 and the multiple surface clip 110 of a single SRD spider 100 are in an open position, a wafer 112 can be physically removed from, or inserted into, position on the SRD spider 100. The single post clips 108 and the multiple surface clip 110 are configured to allow the wafer 112 to travel upward relative to the SRD spider (above the clips) only when the single post clip 108 and the single post clips are in their open position. The single post clips 108 and the multiple surface clip 110 limit excessive upward or outward travel of the wafer 112 within the SRD spider when the single post clips 108 and the multiple surface clip 110 is in their closed position.

Materials of all components in the SRD spider have been selected such that static electricity build up is prevented. Materials such as SEMITRON® (a registered trademark of DSM), silicon carbide, and a variety of composite or plastic materials, may be selected for the SRD spider that have a resistivity that is less than about $10^{-6}$ Ohms. The use of such materials ensures no static electricity buildup on the SRD spider 100. A discharge of static electricity from the SRD spider could potentially pass through the wafer 112, thereby damaging the wafer and the electrical components contained therein.

Wafer 112 has a generally circular edge portion 113 defined about wafer axis 105. A flatted edge portion 114 formed on each wafer provides the exception to the generally circular configuration of the wafer 112. The flatted edge portion 114 is utilized in certain semiconductor wafer processing tools to orient the wafer 112 relative to the chamber, robot, holder, or other device during wafer transfer and during a variety of processes. Certain wafer processing equipment is heavily dependant upon the orientation of the wafer 112, so the flatted surface provides a reference edge that can be used by the orienting machines to orient the wafer 112 as desired. For example, wafer orienting machines orient the flatted edge of all wafers in the same prescribed direction. The multiple surface clip 110 is configured to be positioned adjacent, and interact with, the flatted edge portion 114. The relative positioning of the flatted edge of the wafer 112 and the multiple surface clip 110 limits rotation between the wafer and the SRD spider 100.

The radius of wafer 112 (taken about wafer vertical axis 105) is constant except at the flatted edge portion 114. At flatted edge portion 114, the radius length of the wafer 112 gradually decreases from the maximum circumferential radius point 170B adjacent the point where the flatted edge intersects with each circular edge portion 113. The radius length of the wafer gradually decreases following the flatted edge portion 114 until the minimum circumferential radius point 170A is reached, and then gradually increases to the other maximum circumferential radius point 170B. When the wafer is inserted in the SRD spider in the embodiment of SRD spider shown in FIG. 3, the flatted edge 114 is in the position shown by line 114'.

When the flatted edge of the wafer is in position shown by line 114', a space or clearance is defined between the flatted surface 114 of the wafer 112 and both of the wafer catching posts 142 and 143. The space or clearance, 115 extends between lines 114' that indicates the position of flatted edge 114 following insertion, and posts 142 and 143. Angular acceleration of the SRD spider 100 about vertical axis 105 results in a relative acceleration of the wafer relative to SRD spider in the opposed angular direction. The increasing radius of the portion of the flatted edge portion 114 that intersects with the multiple surface clip 110 limits relative rotation between the wafer and the SRD spider 100. Such relative angular rotation between the wafer and the SRD spider results in the wafer being wedged into position within the SRD spider.

2. Single Post Clip

FIG. 6C depicts a SRD spider 100 having two single post clips 108 and a multiple surface clip 110. The structure and operation of single post clips 108 will now be described in more detail by reference to FIG. 2. Each single post clip 108 comprises a clip body 116, a single vertically oriented post 118, an O-ring 120, and a centrifugal wafer clip 122. The clip body 116 is secured to the arm 106 by a screw, bolt, weld, adhesive, or any other known suitable fastener 1202. The single vertically oriented post 118 extends vertically upward from an upper surface of the clip body. The O-Ring 120 extends circumferentially around each single vertically oriented post 118 in a location to support the wafer 112 when the wafer is positioned within the SRD spider 100.

The centrifugal wafer clip 122 is hinged to the clip body 116 by pivot 124. The pivot 124 generally extends tangentially to the circular edge portion 113 of the wafer 112, and perpendicular to the spider leg 106 in the horizontal plane. A wafer positioned in the single post clip 108 rests on the O-ring 120. The centrifugal wafer clip 122 comprises a weighted end 126 and a securing end 125 that are positioned at opposite ends of the centrifugal wafer clip that where the pivot 124 is attached to the centrifugal wafer clip. The moment arm of the weighted end 126 about the pivot 124 exceeds the moment arm of the securing end 125 about the pivot. Therefore, gravitation and/or centrifugal forces applied to the weighted end 126 primarily determine whether the centrifugal wafer clip 122 is open or closed.

Figure 9:
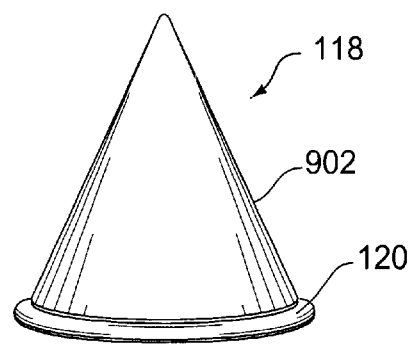
FIG. 9 is a side view of one embodiment of wafer catching post.
Figure 10:
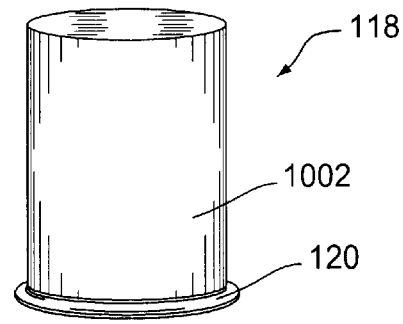
FIG. 10 is a side view of an alternate embodiment of wafer catching post.
Figure 11:
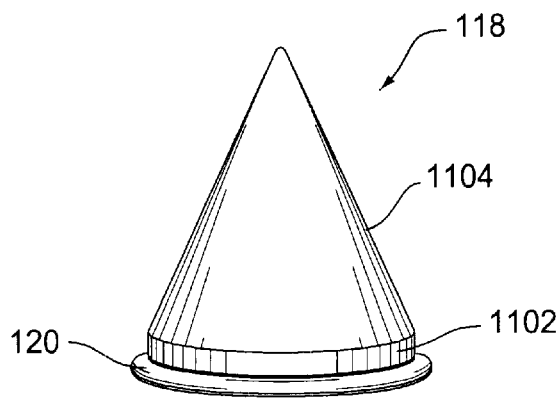
FIG. 11 is a side view of yet another alternate embodiment of a wafer catching post.

One embodiment of single vertically oriented post 118 shown in FIG. 9 has a generally inverted conical configuration 902. Another embodiment of single vertically oriented post 118 has a cylindrical configuration 1002 as shown in FIG. 10. FIG. 11 shows yet another alternate embodiment of wafer catching post formed from a lower cylindrical portion 1102 and an upper inverted conical portion 1104. The surface of the wafer catching post limits outward travel of the wafer past the cone when the wafer is contained within the SRD spider 100. The single post clip 108 is also referred to as a single surface clip since the single vertically oriented post 118 may also take the form of another surface. The clip body 116 forms a support for the remainder of the elements of the single post clip or single surface clip 108.

Figure 12:
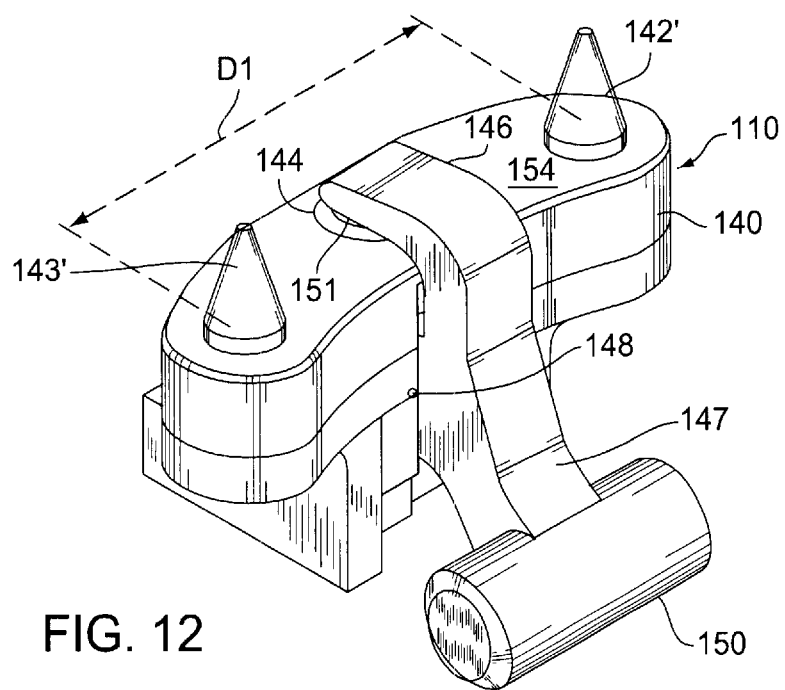
FIG. 12 is a perspective view of one embodiment of the multiple surface clip shown in FIG. 6C.

When the SRD spider 100 is not angularly rotating or accelerating, the gravity force applied to the weighted end 126 forces the centrifugal wafer clip 122 into an open position around the pivot 124 in a direction indicated by arrow 1210. In the open position, the top of the centrifugal wafer clip is removed from being proximate the surface of any wafer 112 located within the SRD spider 100 such that a wafer can be removed from, or inserted into, the SRD spider. When the SRD spider 100 angularly rotates about the spider hub axis 105, the centrifugal force acting on weighted end 126 rotates the centrifugal wafer clip 122 around pivot 124 (counter-clockwise as shown in FIG. 12) into a closed position. When in the closed position, the centrifugal wafer clip 122 extends over an edge of a wafer 112 contained in the SRD spider 100 to limit upward travel of a wafer past the wafer clip 122. The centrifugal wafer clip 122 will thus be closed during rotation to secure the wafer 112 from lifting off the SRD spider.

To insert a wafer 112 in the SRD spider 100, all rotation of the SRD spider 100 is first stopped, and the wafer 112 is dropped into position by a robot within the surfaces defined by the single vertically oriented posts 118 of the single post clips. When being inserted into position, the wafer 112 slides down the inverted conical edge surfaces of the single vertically oriented posts 118 in the single post clips 108 into a loaded or inserted position within the SRD spider 100. The surfaces of the wafer will come to rest on the O-rings 120. The O-rings support the wafer 112 from below during the processing thereof. Once the O-rings 120 of the single post clips 108 support the wafer 112 then the SRD spider 100 can begin rotating around spider hub axis 105. The rotation of the SRD spider results in the centrifugal wafer clip 122 pivoting under the centrifugal force applied to the weighted end 126 into the centrifugal wafer clip's closed position, thereby retaining the wafer in position. Following the SRD process, the rotation of the SRD spider 100 stops. The centrifugal wafer clip 122 then rotates under the influence of gravity into the centrifugal wafer clip's open position. A robot can vertically remove the wafer from the SRD spider 100.

Though single post clips 108 are used in combination with the multiple surface clip 110 in this embodiment, any known type of clip that limits lateral and vertical motion of a wafer in a SRD spider 100 may be used in a combination with the multiple surface clip 110.

3. Multiple Surface Clip

One embodiment of a multiple surface clip 110 comprises a plurality of wafer catching posts 142 and 143. The embodiment of SRD spider 100 shown in FIG. 6C is configured to limit the wafer being excessively wedged between the one multiple surface clip 110 and a plurality of single post clips 108. The multiple surface clip 110 is shown as part of the embodiment of the SRD spider 100 in FIGS. 3 and 6C, in perspective view in FIG. 12, and in side cross-sectional view in FIGS. 4 and 5.

The multiple surface clip 110 comprises clip body 140, wafer catching posts 142 and 143, O-ring 144, and centrifugal wafer clip 146. The clip body 140 secures the wafer catching posts 142 and 143, the O-ring 144, and the centrifugal wafer clip 146 to the spider leg 106C. The clip body 140 is attached at a distal end of spider leg 106C by a fastener 152 such as screw, bolt, pin, adhesive, glue, and other fasteners. The O-ring 144 is attached to the clip body 140 between the wafer catching posts 142 and 143 to cushion and support the wafer from below. The wafer catching post 142, wafer catching post 143, O-ring 144, and centrifugal wafer clip 146 are attached to the clip body 140. The O-ring 144 is positioned on the upper surface of the clip body 140 in a location between the wafer catching posts 142 and 143 that a wafer can rest on. The wafer catching posts 142 and 143 are each spaced from each other, and extend vertically upward from the upper surface of the clip body 140. Pivot 148 horizontally extends through the centrifugal wafer clip 146 in a direction perpendicular to the spider leg 106C. The centrifugal wafer clip 146 includes a weighted end 150 at one end, and a retaining portion end 151 at an end of the centrifugal wafer clip that is opposed from the weighted end 150. The moment of the weighted end about pivot 148 exceeds the moment of the retaining portion end 151 about pivot 148. Therefore, the forces of centrifugal force and gravity acting on the weighted end 150 will largely determine the orientation of the centrifugal wafer clip about the pivot 148.

The wafer catching posts 142 and 143 secure the flatted edge portion 114 of wafer 112 laterally in position when a wafer is inserted in the SRD spider 100 and during processing. While two wafer catching posts 142 and 143 are shown in the embodiment of FIG. 12, any number of wafer catching surfaces, such as a surface that is contoured as a ridge, three surfaces, etc., may be used in the multiple surface clip 110 to limit the rotation of the wafer 112 relative to the SRD spider 100. Additionally, if the SRD unit 700 in the embodiment shown in FIG. 7 always angularly accelerates in the same angular direction after a wafer 112 is inserted into the SRD spider 100, then the flatted edge portion 114 of the wafer wedges into position with the same wafer catching post 142 or 143.

The centrifugal wafer clip 146 is displaceable between the closed and the open positions to respectively secure a wafer and permit release of a wafer relative to the SRD spider. The centrifugal wafer clip 146 comprises arm 147, pivot 148, weighted end 150, and retaining portion end 151. The arm 147 is configured to pivot about pivot 148. Each arm 147 has a minimum cross sectional configuration to permit fluid from a nozzle directed at the backside of the wafer to cover as much of the backside as possible. Weighted end 150 is attached to one end of the centrifugal wafer clip. The moment arm of the weighted end 150 about the pivot 148 exceeds the moment arm of the retaining portion end 151 about the pivot. Gravitation and/or centrifugal forces applied to the weighted end 150 primarily determine whether the centrifugal wafer clip 146 is open or closed. The weighted end 150 biases the centrifugal wafer clip 146 into the open position under the influence of gravity, or the closed position under the influence of centrifugal force. Retaining portion end 151 overlies the wafer to limit upward travel of the wafer away from the SRD spider 100 when the multiple surface clip 110 is closed.

Figure 13:
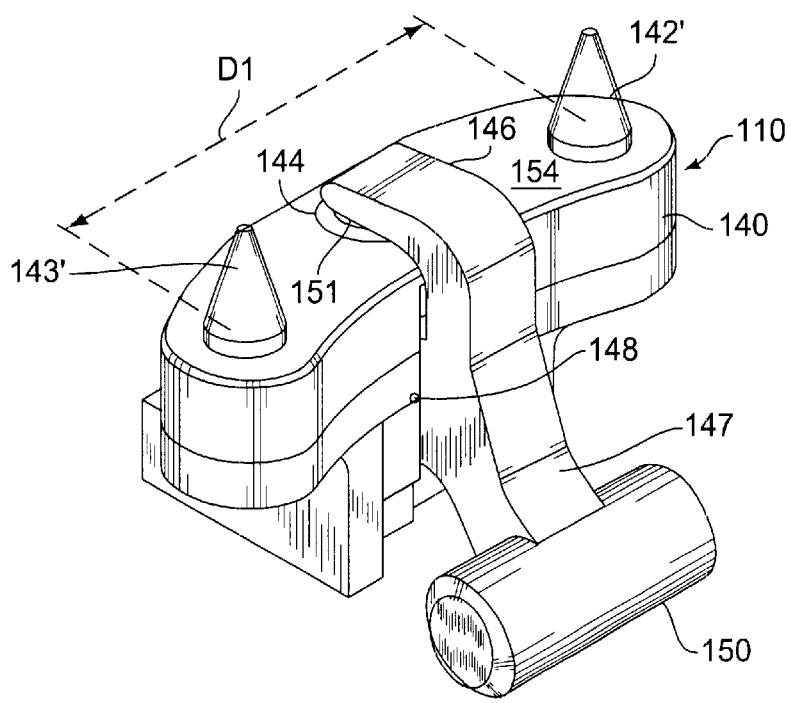
FIG. 13 is a perspective view of an alternate embodiment of the multiple surface clip from that shown in FIG. 12.

Wafer catching posts 142 and 143 preferably have surface configurations as shown in FIGS. 2 and 13 that facilitate wafer transfers onto and off of the SRD spider. Thus, as the wafer is placed on the SRD spider 100 for processing., the conical sections on wafer catching posts 142 or 143 of the multiple surface clip 110, and single vertically oriented posts 118 of the single post clips 108 help guide the wafer into the correct inserted position within the SRD spider 100. The wafer can be easily removed from the SRD spider 100 since upward motion of the wafer increases the horizontal spacing between the wafer and each of the multiple surfaces of the vertically oriented posts 118 of the single post clips 108 and the wafer catching posts 142 or 143 of the multiple surface clip 110. This increased spacing results from the inverted conical contour of these surfaces.

Figure 3:
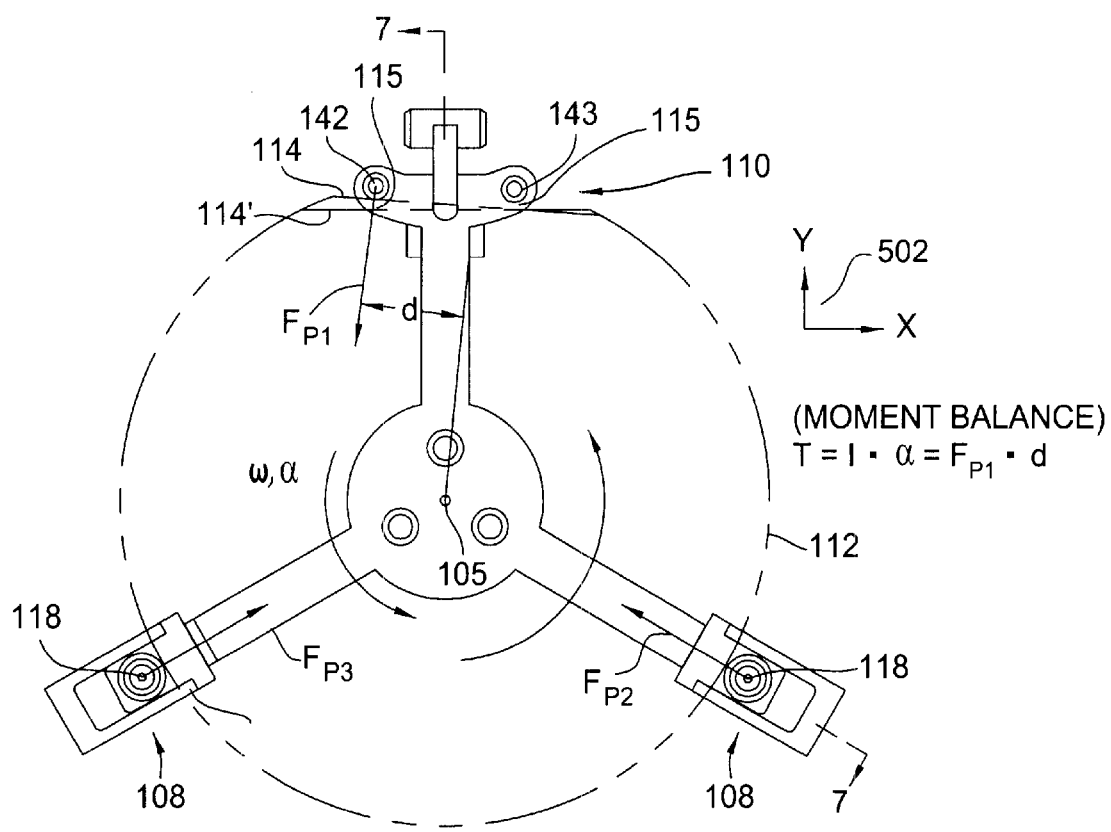
FIG. 3 is a top view of one embodiment of centrifugal wafer drying system spider with applicable angular accelerations, angular velocities, moments, and forces indicated.

The increased horizontal spacing d is shown in FIG. 3 between line $F_{P1}$ representing the force that the wafer catching post 142 or 143 exerts against the flatted edge 114 and line extending through axis 105 that is parallel to force $F_{P1}$. The magnitude of d is sufficiently large to limit the creation of a large wedging force between the SRD spider and the wafer. A large wedging force is a wedging force resulting in difficulty in removing a wafer from the SRD spider, or results in a considerable possibility of damage of the wafer upon removal of the wafer from the SRD spider. The value of the moment arm d in the embodiment shown in FIG. 3 is greater than the moment arm valve $d_1$ shown in FIG. 8. The larger moment arm results in the generation of a smaller wedging force in the embodiment shown in FIG. 3 than in FIG. 8. Other suitable post configurations may be used for the wafer catching posts 142, 143 in the multiple surface clip 110 such as those shown in FIGS. 9, 10, and 11.

Wafer catching posts 142 and 143 are spaced apart from each other a distance D1 as shown in FIG. 12. The distance D1 is slightly less than the length of the flatted edge portion 114 of wafer 112. The distance D1 is selected to control the desired moment that creates the wedging force in response to the rotational wafer movement relative to the SRD spider 100. When the multiple surface clip 110 is mounted on the SRD spider, the two wafer catching posts 142 and 143 are spaced perpendicularly from the longitudinal axis of the spider arm 106C, as shown in FIG. 6C. Each wafer catching post 142 and 143 is therefore separated from the longitudinal axis of the spider arm 106C by a perpendicular distance.

$$\frac{D1}{2}.$$

When a wafer is in the wafer's wedged position in the SRD spider 100, the wafer catching post 142 or 143 that contacts the flatted edge 114 of the wafer will do so at a distance d in FIG. 3 that exceeds the distance $$\frac{D1}{2}$$

from the center of the flatted edge. Increasing the distance from the center of the flatted edge at which the wafer catching post 142 or 143 contacts the flatted edge 114 of the wafer decreases the wedging force that can be generated between a wafer 112 and the SRD spider 100. This decrease in the wedging force results because the moment of inertia resisted during the generation of the wedging forces remains identical regardless of wafer catching post positioning.

O-ring 144 is mounted upon an upper face 154 of the clip body 140 (see FIG. 12), and is configured to support a wafer positioned within the SRD spider 100. The centrifugal wafer clip 146 pivots about pivot axis 148 between closed and open as shown respectively in FIGS. 3 and 4. In FIG. 5, the pivot axis 148 (that the centrifugal wafer clip 146 pivots about) extends generally in a direction tangential to the direction of rotation of the SRD spider 100 at the point of attachment of the wafer catching post 142 to the SRD spider. Gravity acts downward on the weighted end 150 to bias the centrifugal wafer clip 146 open when the SRD spider 100 is stationary (not angularly rotating).

Figure 4:
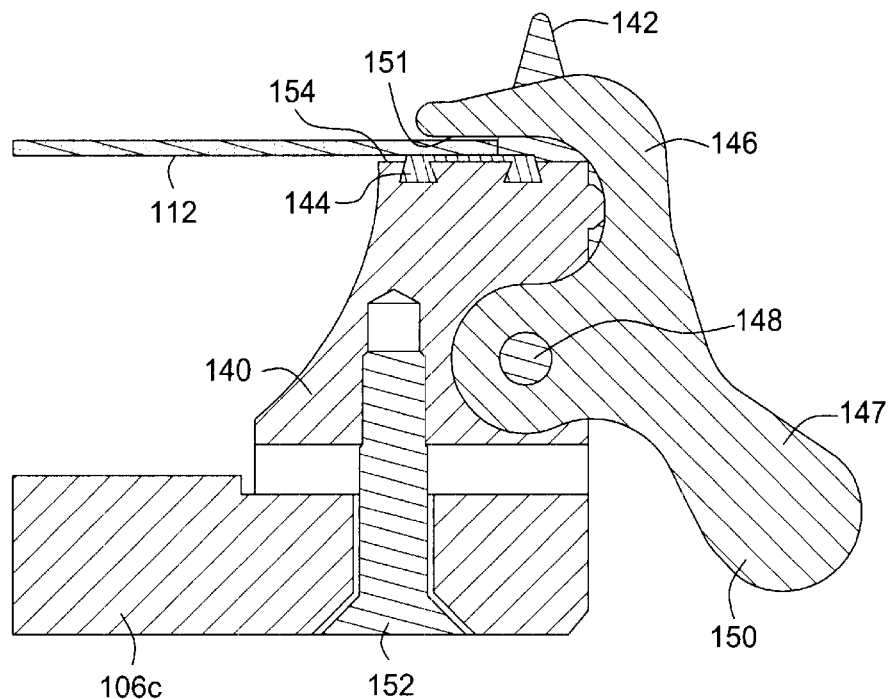
FIG. 4 is a side cross-sectional view of the multiple surface clip of FIG. 3 shown in a closed position.
Figure 5:
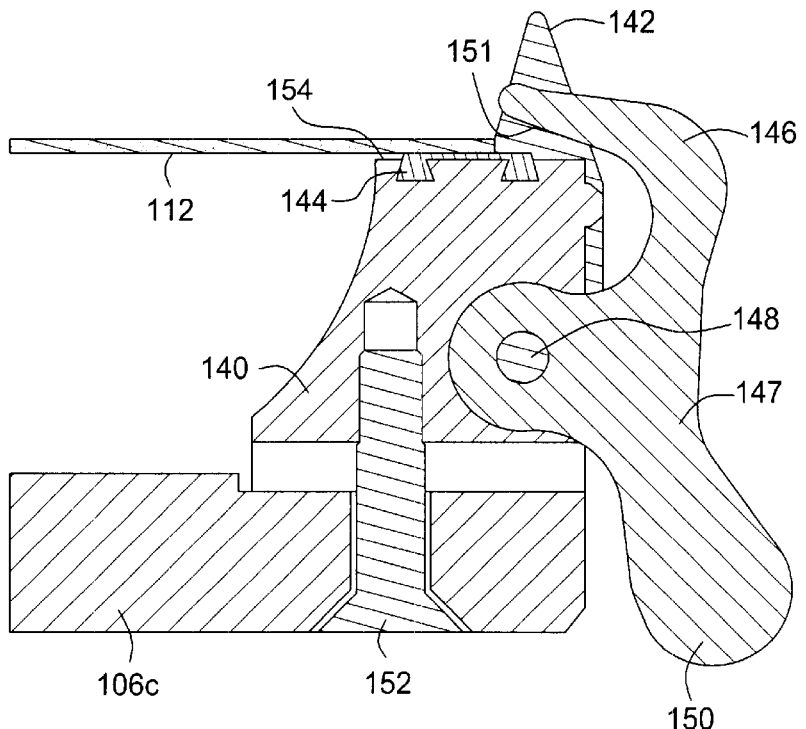
FIG. 5 is a side cross-sectional view of the multiple surface clip shown in FIG. 4 shown in an open position.

In FIG. 4, centrifugal force exerted upon weighted end 150 tends to pivot the centrifugal wafer clip 146 about pivot 148 closed when the SRD spider 100 is rotating at a sufficiently high angular velocity. When the centrifugal wafer clip 146 is closed, the retaining portion 151 overhangs the wafer 112 about the minimum circumferential radius point 170A of the flatted edge portion 114. Thus, when the centrifugal wafer clip 146 is in a closed position, the retaining portion 151 limits upward travel of the wafer, thereby securing the wafer from above during rotation in combination with the single post clips 108. During the angular rotation of the SRD spider 100, the wafer tends to "lift" upwardly due to the air (and other fluids) interacting with the wafer. The action of the centrifugal wafer clips 146 and 122 in holding the wafer down are therefore especially important in maintaining a wafer within the SRD spider 100 during the angular rotations of the SRD spider.

During loading of a wafer within the SRD spider 100, the two wafer catching posts 142 and 143 of the multiple surface clip 110 are positioned adjacent to, but spaced from, the flatted edge portion of the wafer 112. The flatted edge portion of the wafer is positioned as shown in FIG. 3 when the wafer is inserted in the SRD spider. When the wafer is inserted into the SRD spider 100, there is limited free play between the wafer and both the wafer catching posts 142 or 143 of the multiple surface clip 110 and the vertically oriented posts 118 of the single post clips 108 of the SRD spider 100. This limited free play limits the vertical force necessary to vertically force the wafer into position between each of the wafer catching posts 142 or 143 (of the multiple surface clip 110) and the vertically oriented posts 118 (of the single post clip 108) during insertion of the wafer.

Rotations and accelerations of the SRD spider 100 cause a small horizontal angular shift in position between wafer 112 and SRD spider 100 until the wafer is angularly displaced into the wafer's wedged position between the vertically oriented posts 118 of the two single post clips 108 and one of the two wafer catching posts 142 or 143 of the multiple surface clip 110. The wafer shifts into its wedged position is shown in FIGS. 6C and 5. As the radius of the point of the flatted edge portion 114 that is adjacent to the multiple surface clip 110 is increased due to the wafer shifting, the circular edge portion 113 of the wafer 112 is forced into contact with the two single post clips 108. Sufficient further rotation of the wafer 112 acts to wedge the wafer 112 between the vertically oriented posts 118 of the two single post clips 108 and the wafer catching post (142 or 143) of the multiple surface clip 110. For example, the wafer 112 may shift in a clockwise direction relative to the SRD spider 100 (resulting from counter-clockwise angular acceleration or rotation of the SRD spider) into the wedged position shown in outline in FIG. 6C. As the wafer shifts into the wedged position, the multiple surface clip 110 contacts the flatted edge 114 of the flatted surface near to adjacent the maximum circumferential radius point 170B. During clockwise wafer shifting (i.e. during initial counter-clockwise SRD spider rotation), the flatted edge portion 114 is displaced into wedged contact with the wafer catching post 142.

The wafer 112 may shift in a counter-clockwise direction relative to the SRD spider 100 when the SRD spider initially rotates in a clockwise direction. During counter-clockwise wafer shifting, the flatted edge portion 114 wedges into contact with the wafer catching post 143. When flatted edge portion 114 becomes wedged into a wedged position with either post 142 or post 143 (depending upon the initial direction of angular acceleration of the SRD spider that causes the wedging action), further rotations or accelerations in either direction typically do not remove the wafer from the wafer's wedged position. Thus, once the wafer 112 is wedged into position, the wafer and the SRD spider 100 rotate as a unitary structure without relative motion between the wafer and the SRD spider. This unitary rotation is desired since greater angular accelerations and velocities will be imported from the SRD spider to the wafer 112 as a unitary structure than if there is slippage between the SRD spider and the flatter wafer. An increased angular acceleration and velocity of the wafer 112 may enhance the cleaning and drying action of the SRD spider 100. The present invention provides sufficient wedging force to ensure non-slippage between the wafer and the spider without having the wedging forces becoming too great as to prevent the wafer robot from removing the wafer from the SRD spider.

4. Wedging Forces

Figure 8:
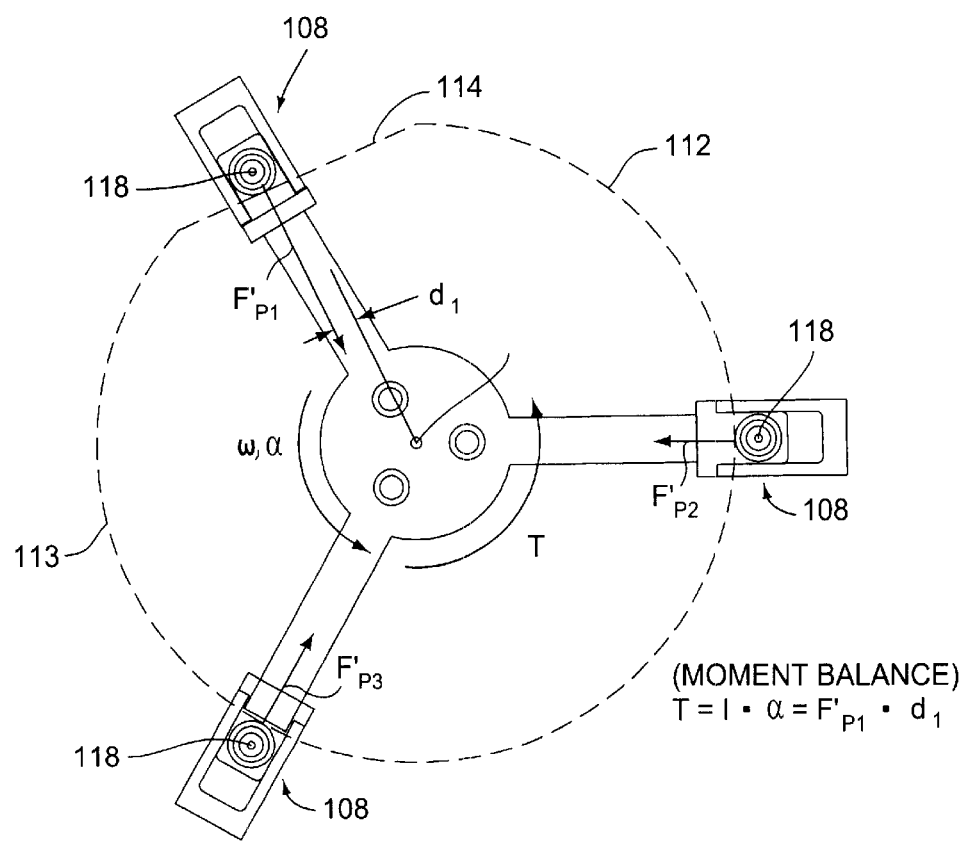
FIG. 8 is the centrifugal wafer drying system spider similar to that shown in FIG. 3, but comprising only single post clips, with applicable angular accelerations, angular velocities, moments, and forces indicated.

FIG. 3 depicts the dynamic force state resulting when the wafer becomes wedged between the post 108 in each of the two single post clips 108 and the wafer catching post 142 (or 143) in the multiple surface clip 110 that are affixed to a SRD spider 100. FIG. 8 depicts the dynamic force state resulting when the wafer becomes wedged between posts in a SRD spider 100 including a plurality of single post clips 108 and one multiple surface clip 110 that should be compared to the dynamic force state in the embodiment shown in FIG. 3.

In the embodiment shown in FIG. 8, the forces $F'_{P1}$, $F'_{P2}$, $F'_{P3}$ are applied in the horizontal plane (parallel to the wafer faces). Forces $F'_{P2}$ and $F'_{P3}$ are applied radially towards the center of the wafer 105 and force $F'_{P1}$ is applied perpendicular to the flatted edge of the wafer. The force $F'_{P1}$ is offset from a line perpendicular to the wafer flat radial 105 by a distance $d_1$. The equilibrium force state is expressed by the following equations:

$$F'_{P1}+F'_{P2}+F'_{P3}=0 \qquad (1)$$

$$T=I\cdot\alpha=F'_{P1}\cdot d_1 \qquad (2)$$

Where I and $\alpha$ are respectively the angular inertia and acceleration of the wafer. Similarly, the embodiment shown in FIG. 3 depicts the dynamic force state resulting when the wafer becomes wedged between vertically oriented posts 118 and wafer catching post 142 or 143 in a SRD spider assembly comprising a multiple surface clip 110. The force $F_{P1}$ is offset from a line that passes through the vertical axis 105 (and is parallel to the force $F_{P1}$ line) by a distance d. The distance d thus acts as a moment arm that rotates the wafer relative to the SRD spider. The equilibrium force state is expressed by the following expressions $$F_{P1}+F_{P2}+F_{P3}=0 \qquad (3)$$

$$T=I\alpha=F_{P1}\cdot d_1 \qquad (4)$$

Torque $^T$ in expressions 2 and 4 is the torque the SRD spider imparts to the wafer to make the wafer rotate. Thus, Torque $^T$ represents the same value (since $I\cdot\alpha$ is constant) in both expressions 2 and 4. Therefore the following expression can be derived, $$F'_{P1}\cdot d_1 = F_{P1}d \qquad (5)$$

By viewing the embodiments shown in FIGS. 5 and 6 together, the so-called moment arm, quantity d is greater than $d_1$. Thus, the wedging force $F'_{P1}$ must be greater than $F_{P1}$ for expression 5 to be true. In mathematical terms, $$d_1 > d \rightarrow F'_{P1} > F_{P1} \quad (6)$$

For instance, assign arbitrary exemplary values to quantities d and $d_1$. Let $d_1 = 1$ inch and $d = 2$ inches, indicating that the moment arm of the force $F_{P1}$ is twice the moment arm that the force $F'_{P1}$. Assigning these values to expression 5 yields:

$$F'_{P1} \cdot 1 = F_{P1} \cdot 2$$

or, $$F'_{P1} = 2 F_{P1} \quad (7)$$

Basically, the ratio of $F'_{P1}$ divided by $F_{P1}$ equals the ratio of d divided by $d_1$. This is expressed by rearranging equation 6, $$\frac{F_{PJ}}{F_{PJ}} = \frac{d}{d_1} \quad (8)$$

Therefore, the larger the moment arm d is, the smaller the wedging force $F_{P1}$ becomes. Based on these equations the associated explanation, the multiple surface clip increases the size of the moment arm d. The above equation that $d = 2d_1$ is illustrative in nature and is not intended to be limiting in scope. In actuality, the value of d may typically be from 2 to 20 (or more) times the value of $d_1$. As such, the wedging force $F'_{P1}$ in the embodiment shown in FIG. 8 generated by a similar wafer undergoing similar accelerations and velocities becomes many times the value of $F_{P1}$. In the embodiment shown in FIG. 3. As a consequence, the wedging forces applied to the wafer that is applied during the angular accelerations and velocities of the wafer in the SRD spider 100 is decreased in the embodiment utilizing the multiple surface clip 110 shown in FIG. 3.

If the wafer becomes heavily wedged between the posts, then the wedging force that must be overcome to remove the wafer from the SRD spider is high and it becomes difficult to remove the wafer from the SRD spider. This difficulty in removing a wedged wafer from a SRD spider can be visualized by equaling the wedging force as horizontal clamping forces that must be overcome by the vertical wafer removing force when the wafer is removed from the SRD spider. The present invention substantially decreases these "clamping" wedging forces and facilitates removal of the wafer from the SRD spider assembly by a robot manipulator. For example, making the distance d in the embodiment shown in FIG. 3 considerably larger than $d_1$ in the FIG. 8 configuration decreases the wedging force.

Even though the above describes a plurality of generally vertically oriented posts being spaced from each other, any other configuration may be provided that provides the contact with the substrate while allowing the clip to rotate as depicted in FIGS. 2 and 3. For example, the embodiment of ridge contacts 142' and 143' shown in FIG. 13 provide contact with the wafer 112. Such ridge contacts 142', 143' would diminish in height near the center of the multiple surface clip 110 to allow the centrifugal wafer clip 146 to pivot between the open and closed positions without contacting either of the ridge contacts. A variety of other contoured configurations of multiple surface clip 110 is within the intended scope of the present invention.

Although various embodiments that incorporate the teachings of the present invention have been shown and described in detail herein, those skilled in the art can readily devise many other varied embodiments that still incorporate these teachings.

What is claimed is:

1. An apparatus for securing a wafer to a centrifugal wafer drying apparatus, comprising:
   at least three arms connected to and extending radially from a hub;
   at least two single surface clips disposed on an end of at least two of the three arms; and
   a multiple surface clip attached to one of the at least three arms, the multiple surface clip comprising:
      a plurality of surfaces spaced perpendicularly to and disposed on a remote end of the one of at least three arms, wherein the plurality of surfaces forms a first moment arm with respect to the hub, the one of at least three arms forms a second moment arm with respect to the hub, and the first moment arm is greater than the second moment arm.

2. The apparatus of claim 1, wherein the first moment arm limits the production of a wedging force between the surfaces and the wafer.

3. The apparatus of claim 2, wherein the wedging force results by relative rotation between the hub and the wafer.

4. The apparatus of claim 1, wherein the multiple surface clip further comprises a clip body to which the surfaces are each connected.

5. The apparatus of claim 4, wherein the surfaces are defined by two or more conically shaped posts extending upward from the clip body.

6. The apparatus of claim 4, wherein the multiple surface clip further comprises a centrifugal wafer clip pivotally connected to the clip body.

7. The apparatus of claim 6, wherein the centrifugal wafer clip is pivotable between a first position for securing the wafer and a second position for wafer transfer.

8. A wafer drying apparatus, comprising:
   a hub having at least three arms extending radially therefrom;
   a single surface clip mounted to a remote end of two of the three arms;
   a multiple surface clip mounted to a remote end of one of the three arms, the multiple surface clip includes at least two posts extending upward from the multiple clip and disposed offset from a longitudinal axis of the arm mounted therewith, wherein each post forms a first moment arm longer with respect to the hub than a second moment arm formed between the hub and the remote end; and
   centrifugal wafer clips pivotally connected to the single surface clips and the multiple surface clip, the centrifugal wafer clips rotate to a wafer receiving position when the wafer is rotated below a predetermined rotational speed, and to a closed position to secure the wafer therein when rotated above the predetermined rotational speed.

9. The apparatus of claim 8, wherein the first moment arm limits the production of a wedging force between the post and the wafer.

10. The apparatus of claim 8, wherein the single surface clip further comprises a cushion device to support the wafer thereon.

11. The apparatus of claim 8, wherein the multiple surface clip further comprises a cushion device to support the wafer thereon.

12. The apparatus of claim 8, wherein at least one of the two posts are conically shaped.

* * * * *